United States Patent
Voldman

(10) Patent No.: US 7,698,678 B2
(45) Date of Patent: Apr. 13, 2010

(54) METHODOLOGY FOR AUTOMATED DESIGN OF VERTICAL PARALLEL PLATE CAPACITORS

(75) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 135 days.

(21) Appl. No.: 11/837,945

(22) Filed: Aug. 13, 2007

(65) Prior Publication Data

US 2008/0301592 A1 Dec. 4, 2008

Related U.S. Application Data

(63) Continuation-in-part of application No. 11/755,502, filed on May 30, 2007.

(51) Int. Cl.
*G06F 17/50* (2006.01)
*G06F 9/45* (2006.01)

(52) U.S. Cl. ............... 716/10; 716/1; 716/2; 716/5; 716/6; 716/8; 716/9; 716/11; 716/18; 703/13; 703/14; 361/735; 361/738; 361/739

(58) Field of Classification Search ............. 716/1–2, 716/5–6, 8–11, 18; 703/13–14; 361/735, 361/738–739
See application file for complete search history.

(56) References Cited

U.S. PATENT DOCUMENTS

| 6,094,335 | A * | 7/2000 | Early ................. 361/303 |
| 6,423,584 | B2 | 7/2002 | Takahashi et al. |
| 6,704,179 | B2 | 3/2004 | Voldman |
| 6,765,779 | B2 | 7/2004 | Stevenson et al. |
| 7,013,436 | B1 * | 3/2006 | Morton et al. ................. 716/1 |
| 7,134,099 | B2 | 11/2006 | Collins et al. |
| 7,453,136 | B2 | 11/2008 | Hakkarainen et al. |
| 2003/0147187 | A1 | 8/2003 | Voldman |
| 2004/0268284 | A1 | 12/2004 | Perez et al. |
| 2005/0032298 | A1 | 2/2005 | Minami et al. |
| 2005/0102644 | A1 | 5/2005 | Collins et al. |
| 2005/0156281 | A1 | 7/2005 | Eshun et al. |
| 2005/0275070 | A1 | 12/2005 | Hollingsworth |
| 2006/0166426 | A1 | 7/2006 | Voldman |
| 2008/0173981 | A1 * | 7/2008 | Chinthakindi et al. ........ 257/535 |
| 2009/0102016 | A1 | 4/2009 | Gebreselasie et al. |

OTHER PUBLICATIONS

Kim et al., 3-Dimensional Vertical Parallel Plate Capacitors in an SOI CMOS Technology for Integrated RF Circuit, 2003, IEEE, pp. 29-32.*

Theng et al., Clamp Placement Optimization in Full-Chip ESD (Electro-Static-Discharge) Design, 2006, IEMT, pp. 202-206.*

(Continued)

*Primary Examiner*—Thuan Do
*Assistant Examiner*—Nghia M Doan
(74) *Attorney, Agent, or Firm*—Wood, Herron & Evans, LLP

(57) ABSTRACT

Apparatus and program product for designing vertical parallel plate (VPP) capacitor structures in which the capacitor plates in different conductive layers of the capacitor stack have a different physical spacing. The methodology optimizes the physical spacing of the plates in each conductive layer to achieve a targeted electrostatic discharge protection level and, thereby, supply electrostatic discharge robustness.

7 Claims, 3 Drawing Sheets

OTHER PUBLICATIONS

Gebreselasie et al, "Vertical Parallel Plate Capacitor Structures", U.S. Appl. No. 11/755,502 filed May 30, 2007.

Plouchart, et al., "Application of an SOI 0.12-um CMOS Technology to SoCs with Low-Power and High-Frequency Circuits", IBM J. Res. & Dev. vol. 47 No. 5/6, Sep./Nov. 2003 pp. 611-629.

Spalla, David C., US Patent and Trademark Office, Office Action issued in related U.S. Appl. No. 11/755,502 dated May 1, 2009.

USPTO, Office Action issued in related U.S. Appl. No. 11/755,502 dated Jan. 4, 2010.

* cited by examiner

METHODOLOGY FOR AUTOMATED DESIGN OF VERTICAL PARALLEL PLATE CAPACITORS

CROSS-REFERENCE TO RELATED APPLICATIONS

This application is a continuation-in-part of Ser. No. 11/755,502, filed May 30, 2007, the disclosure of which is hereby incorporated by reference herein in its entirety.

TECHNICAL FIELD

The invention relates generally to integrated circuit fabrication and, in particular, to an automated methodology for designing vertical parallel plate capacitors characterized by electrostatic discharge robustness.

BACKGROUND OF THE INVENTION

Capacitors are extensively used for storing an electrical charge in filters, analog-to-digital converters, memory devices, control applications, and many other types of integrated circuits. Capacitors, which generally include conductive plates separated by an insulator, have a capacitance contingent upon a number of parameters, such as plate area, the spacing between the conductive plates, and the dielectric constant of the insulator. A common capacitor construction is a vertical parallel plate capacitor (VPP), which includes a stack of conductive plates with adjacent plates in the stack separated by an insulator.

VPP capacitors may be fabricated when the stacked metallization layers of a multi-level interconnect structure are formed by back end of line (BEOL) processing. Although copper metallurgy is frequently used in lower metallization layers of the interconnect structure to increase signal propagation speed, aluminum metallurgy is preferred in upper metallization layers to promote solder and wire bonding. Consequently, the stacked plates of VPP capacitors may have either an aluminum metallurgy or a copper metallurgy correlated with the specific metallization layer in the interconnect structure. Virtue of the BEOL processing, each copper plate is clad along its sidewalls and bottom surface by a barrier layer containing one or more refractory metals. In contrast, each aluminum plate is clad on only its top and bottom surfaces by a barrier layer containing one or more refractory metals.

Circuitry elements in an integrated circuit, such as VPP capacitors, are susceptible to damage from excessively high voltages or currents generated by electrostatic discharge (ESD) events. ESD events may be caused by contact with the human body, by machinery such as manufacturing or test equipment, or in electrically active environments, as may be experiences in many consumer applications. In particular, the sudden and momentary discharge of an ESD event between adjacent aluminum plates or adjacent copper plates in a VPP capacitor can cause damage.

Under ESD testing and during ESD events in an operating device, aluminum plates have been observed to be more prone to damage and failure than copper plates. Generally, ESD-promoted failure may occur by crack initiation and propagation in the dielectric material bordering the conductive plate followed by melting and flow of the aluminum or copper from the plate into the crack. Aluminum plates, which are confined by refractory metal cladding on the top and bottom surfaces, fail by a lateral cracking mechanism, which promotes shorting of adjacent plates in a metallization layer. In contrast, copper plates are confined by refractory metal cladding on the sidewalls and bottom surface and, consequently, fail in a vertical direction. Hence, copper plates have an intrinsically higher resistance to ESD-promoted failure.

A methodology is needed for designing vertical parallel plate capacitors that exhibit increased resistance to ESD-promoted failures.

SUMMARY OF THE INVENTION

In one embodiment, an apparatus comprises a graphical user interface for inputting one or more design parameters for a vertical parallel plate capacitor, a processor coupled with the graphical user interface, and program code configured to be executed by the processor. The program code defines a parameterized cell representing a vertical parallel plate capacitor by automatically determining a number of metallization levels containing plates of a vertical parallel plate capacitor and a material for the plates in each of the metallization layers to collectively satisfy the one or more design parameters. After the number of metallization levels and the material for the plates in each of the metallization layers are determined, the program code automatically optimizes a physical spacing between adjacent pairs of the plates in each of the metallization layers to achieve a targeted electrostatic discharge protection level.

DETAILED DESCRIPTION

Embodiments of the invention relate to systems and methods for automatically designing vertical parallel plate (VPP) capacitors that utilize a different physical spacing between conductive electrodes or plates in different levels of the capacitor stack, which ensures ESD robustness of the VPP capacitor and accompanying design. In the design phase using a computer aided design (CAD) system, layout and circuit schematics are auto-generated with the user capable of varying parameters relating to the VPP capacitor. The ESD design system allows for variations in the amount of chip real estate occupied by the VPP capacitor, as well as the level of ESD protection for the VPP capacitor and the capacitance of the VPP capacitor, in an automated fashion and without additional design work. The automated design system for the VPP capacitor eliminates the need to custom build a VPP capacitor for each new application.

The non-even or non-uniform physical spacing between the conductive plates in the capacitor stack of the VPP capacitor contribute to the ESD robustness and may be material specific. For example, the physical spacing between conductive plates in different levels of the capacitor stack may be chosen based upon material failure mechanisms for conductive plates composed of different materials. As a more specific example, the capacitor stack of the VPP capacitor may include copper plates with a minimum physical spacing between copper plates and aluminum plates with a wider physical spacing between aluminum plates. The wider spacing for the aluminum plates may alleviate ESD-promoted failures of the VPP capacitor structures fabricated from aluminum and copper using back end of line (BEOL)-type processes.

Figure 1:
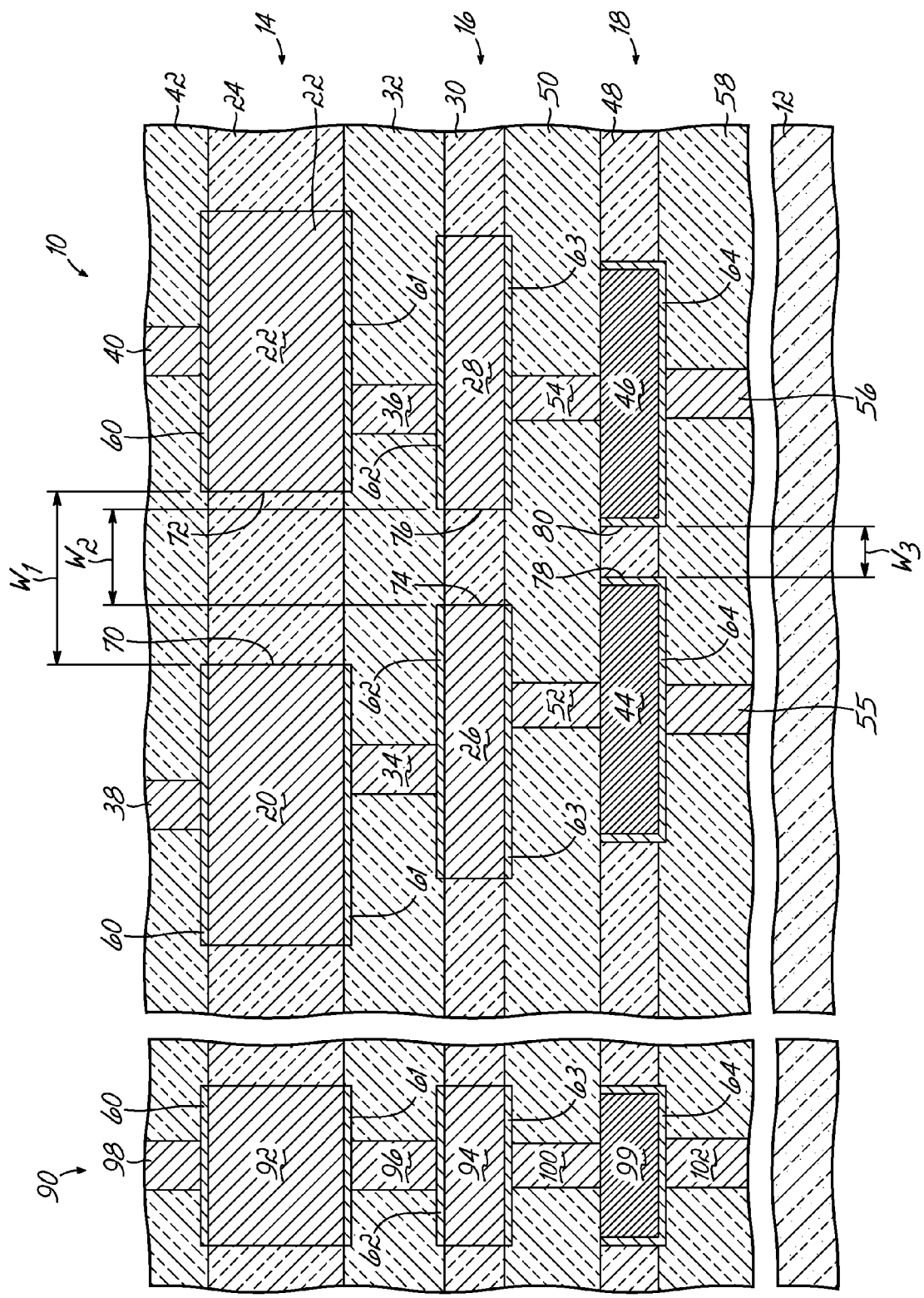
FIG. 1 is cross-sectional view of portions of a substrate carrying a vertical parallel plate capacitor with a different physical spacing between adjacent conductive plates in each metallization layer selected by a design system and method of an embodiment of the invention.

With reference to FIG. 1, a VPP capacitor, generally indicated by reference numeral 10, is carried on a substrate 12, which may be a semiconductor wafer composed of a semiconductor material. Substrate 12 may include various circuits and/or devices (not shown) formed thereon and/or therein with features that are to be contacted. The VPP capacitor 10 includes a capacitor stack defined by a plurality of metallization layers 14, 16, 18. Metallization layer 14 includes a plurality of conductive strips or plates, of which conductive plates 20, 22 are representative, that are formed in an insulating layer 24. Similarly, the underlying metallization layer 16, which is disposed between metallization layer 14 and metallization layer 18, includes a plurality of conductive strips or plates, of which conductive plates 26, 28 are representative, that are formed in an insulating layer 30. An insulating layer 32 is disposed between conductive plates 20, 22 and 26, 28.

Conductive plugs, such as the representative conductive plugs 34, 36, fill vias defined in insulating layer 32. Conductive plug 34 supplies a vertical connection and electrical and physical coupling between conductive plate 20 and conductive plate 26. Conductive plug 36 supplies a vertical connection and electrical and physical coupling between conductive plate 22 and conductive plate 28. Optional additional plugs (not shown) constructed like plugs 34, 36 may be provided to establish multiple points of electrical and physical coupling between conductive plates 20, 22 and conductive plates 26, 28, respectively.

One or more upper metallization layers (not shown) may be disposed in an overlying relationship with metallization layer 14. Conductive plugs, such as the representative conductive plugs 38, 40, fill vias defined in an insulating layer 42 overlying insulating layer 24 and conductive plates 20, 22. Conductive plug 38 may supply a vertical connection and electrical and physical coupling between conductive plate 20 and a conductive plate in an overlying metallization layer. Conductive plug 40 may supply a vertical connection and electrical and physical coupling between conductive plate 22 and a conductive plate in the overlying metallization layer. Optional additional plugs (not shown) constructed like plugs 38, 40 may be provided to establish multiple points of electrical and physical coupling between conductive plates 20, 22 with any overlying conductive plates.

Metallization layer 18 is disposed below metallization layer 16 and, therefore, is disposed between metallization layer 14 and the substrate 12. Metallization layer 18 includes a plurality of conductive strips or plates, of which conductive plates 44, 46 are representative, that are formed in an insulating layer 48. An insulating layer 50 is disposed between the conductive plates 26, 28 in metallization layer 16 and conductive plates 44, 46 and, therefore, between insulating layers 30 and 48. Conductive plugs, such as the representative conductive plugs 52, 54, fill vias defined in insulating layer 50 to supply respective vertical connections and electrical and physical couplings between conductive plates 26, 28 and conductive plates 44, 46, respectively. Optional additional plugs (not shown) constructed like plugs 52, 54 may be provided to establish multiple points of electrical and physical coupling between conductive plates 26, 28 and conductive plates 44, 46, respectively.

Additional lower metallization layers (not shown) may also be disposed between metallization layer 16 and substrate 12. Conductive plugs, such as the representative conductive plugs 55, 56, fill vias defined in an insulating layer 58 underlying insulating layer 48 and conductive plates 44, 46. Conductive plug 55 may supply a vertical connection and physical coupling between conductive plate 44 and a conductive plate in an underlying metallization layer. Conductive plug 56 may supply a vertical connection and physical coupling between conductive plate 46 and a conductive plate in the underlying metallization layer. Optional additional plugs (not shown) constructed like plugs 55, 56 may be provided to establish multiple points of electrical and physical coupling between conductive plates 44, 46, respectively, and any underlying conducting plates.

The insulating layers 24, 32, 42, 48, 50, 58 may be deposited by a conventional technique, such as a chemical vapor deposition (CVD) process or a plasma enhanced CVD (PECVD) process, understood by a person having ordinary skill in the art. The insulating layers 24, 32, 42, 48, 50, 58 may comprise silicon dioxide, fluorine-doped silicon glass (FSG), combinations of these dielectric materials, and other dielectric materials recognized by a person having ordinary skill in the art.

With continued reference to FIG. 1, the conductive plates 20, 22 in metallization layer 14 are clad on two sides (i.e., the upper and lower sides) by regions of barrier layers 60, 61, respectively. The lateral sides of the conductive plates 20, 22 are in direct physical contact with dielectric material in insulating layer 24 and unclad. Similarly, the conductive plates 26, 28 in metallization layer 16 are clad on two sides by barrier layers 62, 63, respectively. The lateral sides of the conductive plates 26, 28 are in direct physical contact with dielectric material in insulating layer 30 and unclad. In contrast, the conductive plates 44, 46 are clad on three sides by barrier layer 64 so that only one side (i.e., the upper side) is in direct physical contact with dielectric material in insulating layer 50 and unclad.

Conductive plates 20, 22 may be formed using a standard lithography and subtractive etching process to pattern a metal stack deposited on insulating layer 32, after the conductive plugs 34, 36 are fabricated. The metal stack includes barrier layer 61, such as a bilayer of titanium and titanium nitride, a layer of a metal, such as aluminum, and barrier layer 62, such as another bilayer of titanium and titanium nitride. Conductive plates 20, 22 may be defined from the metal stack by applying a resist layer (not shown), patterning the resist layer, anisotropically etching the metal stack using, for example, a reactive ion etching (RIE) process, capable of producing substantially vertical sidewalls, and stripping residual resist from the conductive plates 20, 22 by, for example, plasma ashing or a chemical stripper. Insulating layer 24 is deposited as a gap fill material and polished to a substantially planar condition by, for example, a chemical mechanical polishing (CMP) process. Conductive plates 26, 28 are formed in insulating layer 30 by a similar procedure as the procedure forming conductive plates 20, 22.

Conductive plates 44, 46 may be formed in insulating layer 48 by a conventional single damascene process. After insulating layer 48 is deposited, troughs are formed in the insulating layer 48 using a conventional lithography and etching process. A resist layer (not shown) is applied to cover insulating layer 48, is exposed to impart a latent image pattern of the troughs, and is developed to transform the latent trench image pattern into a final image pattern with unmasked areas that expose insulating layer 24 at the future locations of the troughs. Troughs with substantially vertical sidewalls are defined in the unmasked area of insulating layer 48 with an etching process, such as plasma etching or RIE. After the etching process is concluded, residual resist is stripped from insulating layer 48 by, for example, plasma ashing or a chemical stripper. Alternatively, the vias for conductive plugs 55, 56 and the troughs for conductive plates 44, 46 may comprise a dual-damascene pattern formed by a via-first, trough-last process sequence or a trough-first, via-last process sequence. The ability to perform dual damascene process steps, regardless of order, is familiar to a person having ordinary skill in the art.

Suitable materials for conductive plates 20, 22, 26, 28, 44, 46 of the VPP capacitor 10 and conductive plugs 34, 36, 38, 40, 52, 54, 55, 56 include, but are not limited to, copper (Cu), aluminum (Al), tungsten (W), alloys of these metals, and other similar metals. These materials may be deposited by conventional deposition processes including, but not limited to a CVD process and an electrochemical process like electroplating or electroless plating. The barrier layers 60-64 may include any material or multilayer combination of materials recognized by a person having ordinary skill in the art. Exemplary materials for barrier layers 60-64 include, but are not limited to titanium (Ti), titanium nitride (TiN), tantalum (Ta), tantalum nitride (TaN), combinations of these materials, and other like materials. The material constituting barrier layers 60-64 may be formed utilizing conventional deposition processes well known to those skilled in the art, including but not limited to PVD, ionized-PVD (iPVD), atomic layer deposition (ALD), CVD, and plasma-assisted CVD.

The conductive plates in the other metallization layers (not shown) may have a construction analogous to the construction of conductive plates 20, 22 and conductive plates 26, 28, or may have a construction analogous to the construction of conductive plates 44, 46.

Additional process steps are performed to provide electrical connections (not shown) to the conductive plates 20, 22, 26, 28, 44, 46 of the VPP capacitor 10. Specifically, an electrical connection for use in electrically biasing at least one of the conductive plates 20, 26, 44 with a potential having one polarity (e.g., positive) and another electrical connection for use in electrically biasing at least one of the conductive plates 22, 28, 46 with a potential having the opposite polarity (e.g., negative). The conductive plugs 34, 38, 52, 55 electrically couple conductive plates 20, 22, 26, 28, 44, 46 and, optionally, other overlying and underlying conductive plates (not shown). Similarly, the conductive plugs 36, 40, 54, 56 electrically couple conductive plates 22, 28, 46 and optionally other overlying and underlying conductive plates (not shown). The process steps may be subsumed by the process steps forming the conductive plates 20, 22, 26, 28, 44, 46.

Conductive plates 20, 26, 44 are generally aligned in one vertical column, which is biased with one polarity, and conductive plates 22, 28, 46 are generally aligned in another vertical column, which is biased with the opposite polarity. Conductive plates may be provided in additional columns adjacent to the column containing conductive plates 20, 26, 44 and/or to the column containing conductive plates 22, 28, 46. Independent of the number of columns of conductive plates, the bias potential for the columns alternates between the different polarities so that conductive plates in adjacent columns of the VPP capacitor 10 are biased with opposite polarities.

With continued reference to FIG. 1, conductive plates 20, 22, as well as other adjacent pairs of conductive plates (not shown) in metallization layer 14, have confronting sides 70, 72, respectively, spaced apart by first dielectric-filled gap characterized by a first distance, $W_1$. The dielectric material filling the gap originates from insulating layer 24. Similarly, conductive plates 26, 28, as well as other adjacent pairs of conductive plates (not shown) in metallization layer 16, have confronting sides 74, 76, respectively, that are spaced apart by a dielectric-filled gap characterized by a second distance, $W_2$. The dielectric material filling the gap originates from insulating layer 30. Conductive plates 44, 46, as well as other adjacent pairs of conductive plates (not shown) in metallization layer 18, have confronting sides 78, 80, respectively, that are spaced apart by a dielectric-filled gap characterized by a third distance, $W_3$. The dielectric material filling the gap originates from insulating layer 48. The first, second, and third distances are selected to differ from each other so that the conductive plates 20, 22, the conductive plates 26, 28, and the conductive plates 44, 46 are formed with unique pitches. In an alternative embodiment, only two of the first, second, and third distances may differ. Adjacent conductive plates (not shown) in metallization layers (not shown) either overlying or underlying metallization layer 18 may be spaced by distances selected from among the first, second, and third distances, or by one or more additional distances distinct from first, second, and third distances.

Conductive plates 20, 22 may be formed from the same material (e.g., aluminum or aluminum alloy) as conductive plates 26, 28. Alternatively, conductive plates 20, 22 may be formed from a different material (e.g., copper or copper alloy) than conductive plates 26, 28 (e.g., aluminum or aluminum alloy). Similarly, conductive plates 44, 46 may be formed from a different material (e.g., copper or copper alloy) than conductive plates 26, 28 (e.g., aluminum or aluminum alloy) or from the same material as conductive plates 26, 28. Similar considerations apply for the selection of materials forming the conductive plates in overlying and underlying metallization layers (not shown).

Conductive plates 20, 22 in metallization layer 14 may be aligned substantially parallel to each other with top and/or bottom surfaces contained in respective substantially horizontal planes. Similarly, conductive plate 26 may be aligned substantially parallel with conductive plate 28 with top and/or bottom surfaces contained in respective substantially horizontal planes, and conductive plates 44, 46 may be aligned substantially parallel with each other with top and/or bottom surfaces contained in respective substantially horizontal planes. Alternatively, one or more of the horizontal plate alignments in each of the metallization layers 14, 16, 18 may vary from parallel.

In one embodiment, conductive plate 20 in metallization layer 14 directly overlies conductive plate 26 in metallization layer 16 and conductive plate 44 in metallization layer 18. Similarly, conductive plate 22 in metallization layer 14 may directly overlie conductive plate 28 in metallization layer 16 and conductive plate 46 in metallization layer 18. Alternatively, conductive plates 20, 22 may be shifted horizontally relative to conductive plates 26, 28 and/or conductive plates 26, 28 may be shifted horizontally relative to conductive plates 44, 46 so that direct vertical alignment is relaxed, while maintaining the pitch or spacing between adjacent plate pairs in the different metallization layers 14, 16, 18.

The non-even physical spacing of the conductive plates 20, 22, the conductor plates 26, 28, and the conductor plates 44, 46 in the capacitor stack decrease the susceptibility of the capacitor stack of the VPP capacitor 10 to ESD-promoted failures. The non-even physical spacings may be material specific in that, for example, the physical spacing in different levels of the capacitor stack may be chosen based upon material plate failure mechanisms.

In an alternative embodiment, the metallization layers 14, 16, 18 may also contain a multilevel interconnect structure, which is generally indicated by reference numeral 90. The interconnect structure 90, which is formed by the BEOL processes, interconnects the various circuits and/or devices (not shown) formed on substrate 12 by front end of line (FEOL) processes, electrically contacts features on substrate 12, and also provides connections to external contacts (not shown).

Metallization layer 14 may further include a plurality of conductive lines, of which conductive line 92 is representative, that are formed in insulating layer 24 and are clad by portions of barrier layers 60, 61. The underlying metallization layer 16 may also include a plurality of conductive lines, of which conductive line 94 is representative, that are formed in insulating layer 30 and are clad by portions of barrier layers 62, 63. Conductive plugs, such as the representative plug 96, fill vias defined in insulating layer 32 and, thereby, supply vertical connections between the conductive lines 92, 94. Conductive plugs, such as the representative plug 98, fill vias defined in insulating layer 42 and, thereby, supply vertical connections between conductive lines 92 and an optional overlying conductive line (not shown) in an overlying metallization layer.

Metallization layer 18 also includes a plurality of conductive lines, of which conductive line 99 is representative, that are formed in insulating layer 48. The conductive line 99 is isolated from insulating layers 48, 58 by barrier layer 64. Conductive plugs, such as the representative plug 100, fill vias defined in insulating layer 50 to supply vertical connections between the conductive lines 94, 99. Conductive plugs, such as the representative plug 102, fill vias defined in insulating layer 58 and, thereby, supply vertical connections between conductive line 99 and an optional underlying conductive line (not shown) in an underlying metallization layer.

Figure 2:
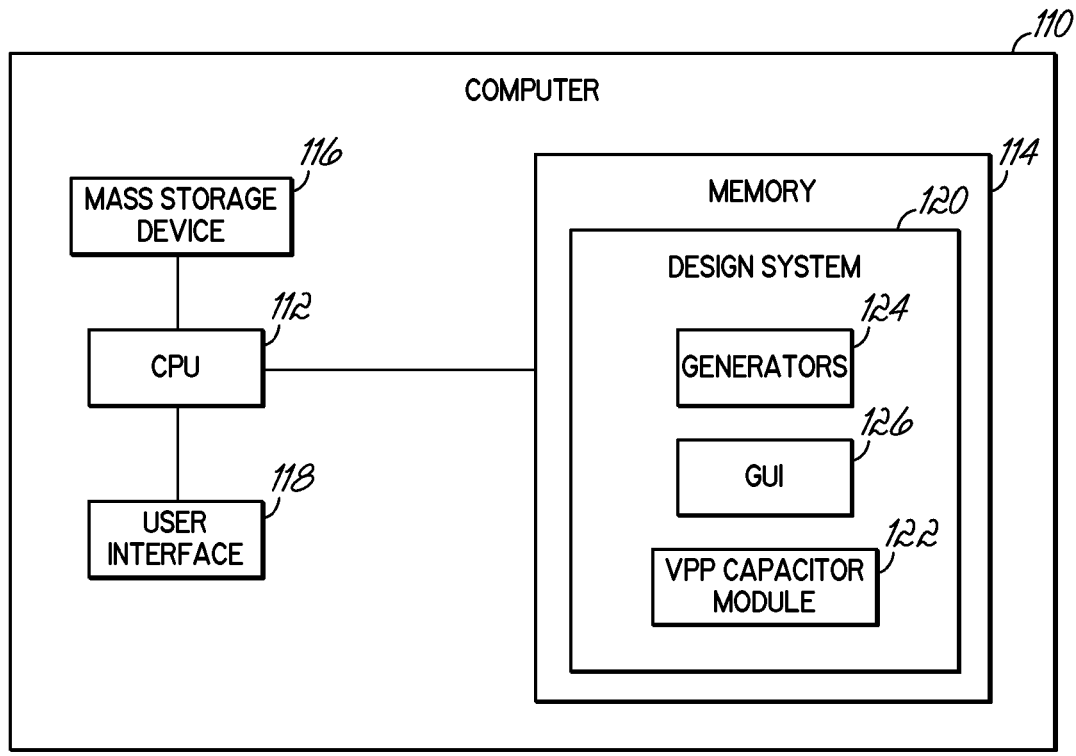
FIG. 2 is a block diagram of the principal hardware components in an apparatus suitable for implementing the design system consistent with the embodiments of the invention.

With reference to FIG. 2, an apparatus in the representative form of a computer 110 for implementing the embodiments of the invention includes a central processing unit (CPU) 112 comprising one or more microprocessors, a memory 114 coupled with the CPU 112, a mass storage device 116 coupled with the CPU 112, and a user interface 118 coupled with the CPU 112. Memory 114 contains a design system 120 and a program product in the form of a VPP capacitor module 122 that, when executing on the CPU 112, directs various functional capabilities described in further detail below.

Memory 114, which may represent the random access memory (RAM) devices comprising the main storage of computer 110 as well as any supplemental levels of memory, e.g., cache memories, non-volatile or backup memories (e.g., programmable or flash memories), read-only memories (ROMs), etc. In addition, memory 114 may be considered to include memory storage physically located elsewhere in computer 110, e.g., any cache memory in a microprocessor in CPU 112, as well as any storage capacity used as a virtual memory, e.g., as stored on mass storage device 116. The mass storage device 116 may comprise one or more of a floppy or other removable disk drive, a hard disk drive, a direct access storage device (DASD), an optical drive (e.g., a CD drive, a DVD drive, etc.), and/or a tape drive. The memory 114 and mass storage device 116 may reside at a single physical location or be distributed across a plurality of physical systems.

The user interface 118 may incorporate one or more user input devices (e.g., a keyboard, a mouse, a trackball, a joystick, a touchpad, and/or a microphone, among others) and a display (e.g., a CRT monitor, an LCD display panel, and/or a speaker, among others). Additional components, such as cache memory, communication systems, system software, etc., may also be incorporated into computer 110.

Computer 110 operates under the control of an operating system (not shown), and executes or otherwise relies upon various computer software applications, components, programs, objects, modules, data structures, etc. (e.g., design system 120 and VPP capacitor module 122). Moreover, various applications, components, programs, objects, modules, etc. may also execute on one or more processors in another computer coupled to computer 110 via a network, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include, but are not limited to, tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 2 is not intended to limit the present invention. Indeed, those skilled in the art will recognize that other alternative hardware and/or software environments may be used without departing from the scope of the invention.

Design system 120, which includes generators 124 and a graphical user interface (GUI) 126, may represent any commercially available CAD software environment. Generators 124, which automatically design integrated circuit representations without designer intervention, may include any known type of design generator or combination of design generators, such as a graphical generator or a schematic generator. A graphical generator identifies a circuit element, circuit, or a plurality of circuits through shape manipulation and shape definition. A schematic generator develops a circuit diagram as a schematic representation of an integrated circuit. The GUI 126 is used to modify the design and to make the design choices in the design system 120 as understood by a person having ordinary skill in the art.

As a specific example, the design system 120 may be a CADENCE® software environment, which is commercially available from Cadence Design Systems, Inc. of San Jose, Calif., in which the graphical, schematic, and symbolic representations are known as cellviews. Cellviews are constructed from parameterized cells (i.e., P-Cells), which are modified via GUI 126 to a constrained set of design parameters. Integrated circuits are formed through the CADENCE® software environment, where parameters are passed to the higher-order circuit elements, which themselves become P-Cells after compilation, known as hierarchical P-Cells.

Each P-Cell is essentially a computer model of a particular element, such as a VPP capacitor, comprising all of the parameters necessary for the computer 110 to simulate that element. The parameters that define the device itself are fixed while others of the parameters may be defined by the user, depending on the needs of the integrated circuit to be designed. Parameters may also be auto-generated based on other user input considerations, such as a desired ESD robustness or protection level. Higher-level hierarchical P-Cells inherit the user defined parameters and auto-generated parameters from the master P-Cells. The hierarchical P-Cells are scalable elements such that they can form repetition groups of the master P-Cell element to accommodate many different design parameters. The P-Cells fix some parameters, and pass some parameters to the hierarchical P-Cells through inheritance. In this environment, hierarchical P-Cells are built in cellviews using computer 110 from master P-Cells, which store the spatial, shape, and circuit information. The design system 120 may also include verification and checking tools.

In particular, design system 120 uses generator 124 to generate and define a master P-Cell representing a design for the VPP capacitor 10 (FIG. 1) as understood by a person having ordinary skill in the art. The master P-Cell for the VPP capacitor 10 resides in a library or database accessible to the design system 120 and contains definitions for all parameters and their default values. A parameter and its default value can be added, changed, or deleted to create a hierarchical P-Cell from the master P-Cell for the VPP capacitor 10. Hierarchical P-Cells are formed by combining and compiling the master P-Cell. For example, a hierarchical P-Cell for a VPP capacitor structure may represent multiple instances of the master P-Cell representing VPP capacitor 10 (FIG. 1) that are electrically connected in parallel.

Figure 3:
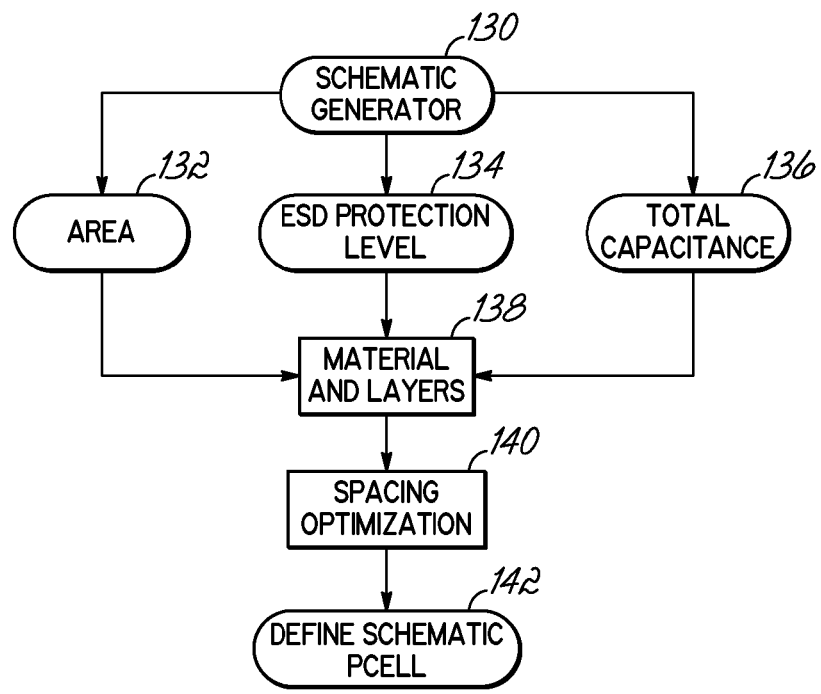
FIG. 3 is a flow chart of a design system in accordance with an embodiment of the invention that relies on a schematic generator to define a P-Cell for designing a vertical parallel plate capacitor.

With reference to FIG. 3 and in accordance with one embodiment of the invention, the generator 124 (FIG. 2) of design system 120 is a schematic generator, as indicated in block 130, that operates within the software environment of the design system 120. In conjunction with the VPP capacitor module 122 (FIG. 2), the schematic generator generates a schematic P-Cell of conductive plates representing the VPP capacitor 10 (FIG. 1). The user supplies one or more input parameters to the schematic generator via GUI 126 (FIG. 2). The input parameters are the area of the VPP capacitor 10 in block 132, an ESD robustness or protection level desired for the VPP capacitor 10 in block 134, and/or a total capacitance for the VPP capacitor 10 in block 136. Based upon the one or more input parameters and as indicated in block 138, the schematic generator has the ability to automatically make a design decision that selects the number of metallization layers and the specific conductor material for the conductive plates in each of the metallization layers to satisfy the one or more input parameters.

In block 140 and in conjunction with the design decision made by the schematic generator in block 138, the design system 120 then automatically performs a spacing optimization. The spacing optimization individually calculates or determines a physical spacing (e.g., $W_1$, $W_2$, $W_3$ in FIG. 1) between adjacent conductive plates (e.g., conductive plates 20, 22, conductive plates 26, 28, and conductive plates 44, 46 in FIG. 1) in any given metallization layer (e.g., metallization layers 14, 16, 18 in FIG. 1). The design system 120 optimizes these inter-plate physical spacings, which are non-even or non-uniform and material specific as described hereinabove, to achieve a desired ESD protection level. In block 142, the design system 120 generates a schematic P-Cell representing the capacitor stack of VPP capacitor 10 as understood by a person having ordinary skill in the art. If less than all input parameters are specified by the user through GUI 126, then the schematic generator may use an iterative process that loops through blocks 138 and 140 to select and optimize all input parameters for the schematic P-Cell. The use of the iterative process can conform the schematic P-Cell until all unspecified input parameters are acceptable. The user may also be given the option to manually adjust the input parameters via GUI 126 to optimize the schematic P-Cell.

Figure 4:
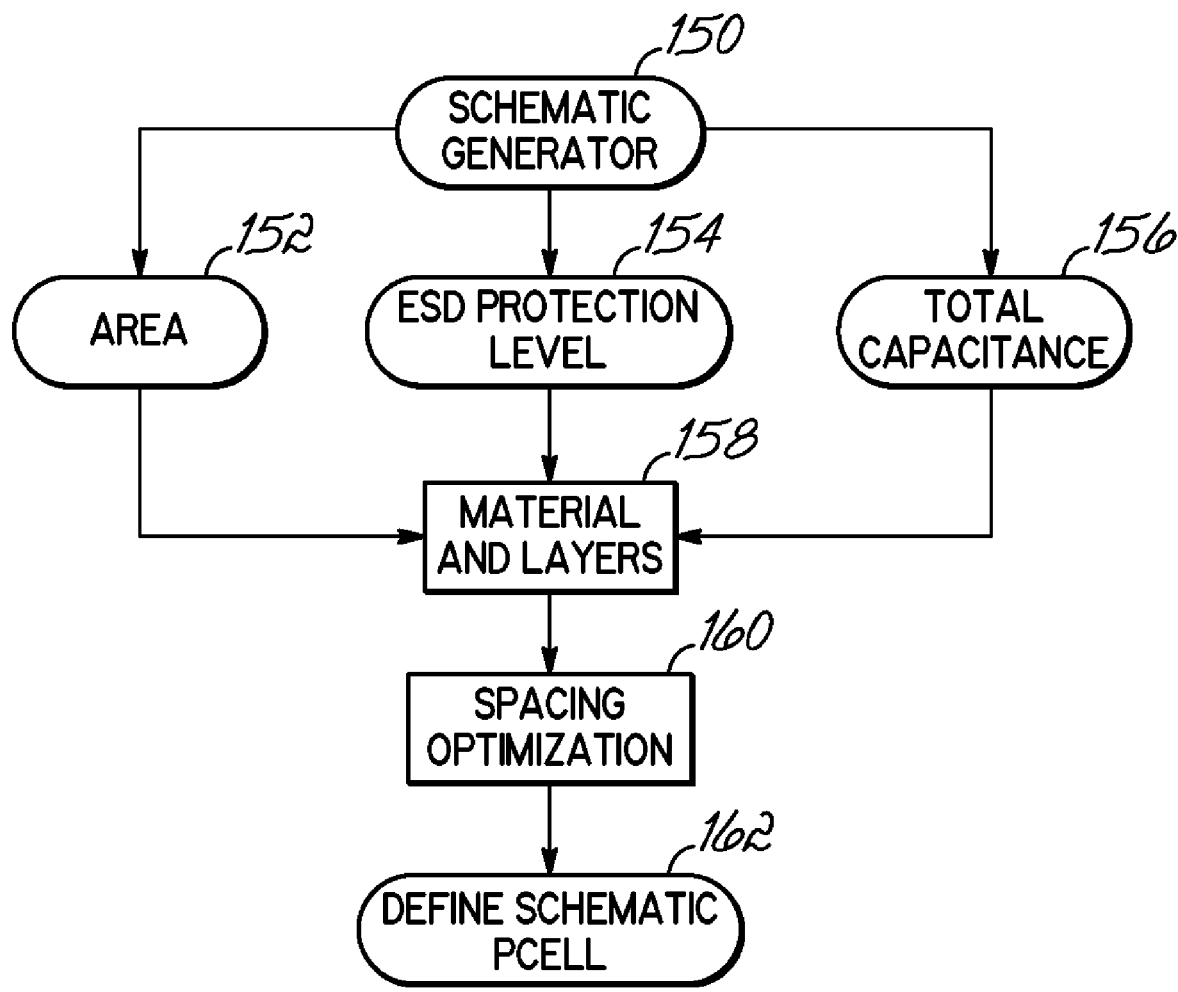
FIG. 4 is a flow chart of a design system in accordance with an embodiment of the invention that relies on a graphical generator to define a P-Cell for designing a vertical parallel plate capacitor.

With reference to FIG. 4 and in accordance with another embodiment of the invention, the generator 124 (FIG. 2) of design system 120 is a graphical generator, as indicated in block 150, that operates within the software environment of the design system 120. In conjunction with the VPP capacitor module 122 (FIG. 2), the graphical generator generates a graphical P-Cell representing the VPP capacitor 10 (FIG. 1). The user supplies one or more input parameters to the graphical generator via GUI 126 (FIG. 2). The input parameters are the area of the VPP capacitor 10 in block 152, an ESD robustness or protection level desired for the VPP capacitor 10 in block 154, and/or a total capacitance for the VPP capacitor 10 in block 156. Based upon the one or more input parameters and as indicated in block 158, the graphical generator has the ability to automatically make a design decision that selects the number of metallization layers and the specific conductor material for the conductive plates in each of the metallization layers to satisfy the one or more input parameters.

In block 160 and in conjunction with the design decision made by the graphical generator in block 158, the design system 120 then automatically performs a spacing optimization. The spacing optimization individually calculates or determines a physical spacing (e.g., $W_1$, $W_2$, $W_3$ in FIG. 1) between adjacent conductive plates (e.g., conductive plates 20, 22, conductive plates 26, 28, and conductive plates 44, 46 in FIG. 1) in any given metallization layer (e.g., metallization layers 14, 16, 18 in FIG. 1). The design system 120 optimizes these inter-plate physical spacings, which are non-even or non-uniform and material specific as described hereinabove, to achieve a desired ESD protection level. In block 162, the design system 120 generates a graphical P-Cell representing the capacitor stack of VPP capacitor 10 as understood by a person having ordinary skill in the art. If less than all input parameters are specified by the user through GUI 126, then the graphical generator may use an iterative process that loops through blocks 158 and 160 to select and optimize all input parameters for the graphical P-Cell. The use of the iterative process can conform the schematic P-Cell until all unspecified input parameters are acceptable. The user may also be given the option to manually adjust the input parameters via GUI 126 to optimize the graphical P-Cell.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. Various other frames of reference may be employed for describing the invention without departing from the spirit and scope of the invention. Furthermore, to the extent that the terms "includes", "having", "has", "with", or variants thereof are used in either the detailed description or the claims, such terms are intended to be inclusive in a manner similar to the term "comprising."

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An apparatus comprising:
a graphical user interface for inputting one or more design parameters for a vertical parallel plate (VPP) capacitor;
a processor coupled with the graphical user interface; and
program code configured to be executed by the processor to define a parameterized cell representing a vertical parallel plate capacitor by automatically determining a number of metallization layers each containing a plurality of plates of the VPP capacitor and a material for the plates in each of the metallization layers to collectively satisfy the one or more design parameters and, after the number of metallization layers and the material for the plates in each of the metallization layers are determined, to automatically optimize a physical spacing between adjacent pairs of the plates in each of the metallization layers to achieve a targeted electrostatic discharge protection level,
wherein the program code is configured to automatically optimize the physical spacing between adjacent pairs of the plates in each of the metallization layers based at least partially upon the material for the plates in each of the metallization layers, the material in at least one of the metallization layers, and the physical spacing between adjacent pairs of the plates in an upper one of the metallization layers is larger than the physical spacing between adjacent pairs of the plates in a lower one of the metallization layers that is located between the upper one of the metallization layers and a substrate carrying the VPP capacitor differs from the physical spacing between adjacent pairs of the plates and the material in another of the metallization layers.

2. The apparatus of claim 1 wherein the program code is configured with a graphical generator to automatically determine the number of metallization layers and the material for the plates in each of the metallization layers.

3. The apparatus of claim 1 wherein the program code is configured with a schematic generator to automatically determine the number of metallization layers and the material for the plates in each of the metallization layers.

4. The apparatus of claim 1 wherein the one or more input parameters for the VPP capacitor are selected from a group consisting of an area of the vertical parallel plate capacitor on the substrate, the targeted electrostatic discharge protection level, a total capacitance for the vertical parallel plate capacitor, and combinations thereof.

5. A program product, comprising:
program code configured to define a parameterized cell representing a vertical parallel plate capacitor by automatically determining a number of metallization layers containing plates of a vertical parallel plate capacitor and a material for the plates in each of the metallization layers to collectively satisfy one or more design parameters and, after the number of metallization layers and the material for the plates in each of the metallization layers are determined, to automatically optimize a physical spacing between adjacent pairs of the plates in each of the metallization layers to achieve a targeted electrostatic discharge protection level; and
a computer readable storage medium bearing the program code,
wherein the program code is configured to automatically optimize the physical spacing between adjacent pairs of the plates in each of the metallization layers based at least partially upon the material for the plates in each of the metallization layers, the material in at least one of the metallization layers differs from the material in another of the metallization layers, and the physical spacing between adjacent pairs of the plates in an upper one of the metallization layers is larger than the physical spacing between adjacent pairs of the plates in a lower one of the metallization layers that is located between the upper one of the metallization layers and a substrate carrying the vertical parallel plate capacitor.

6. The program product of claim 5 wherein the program code is configured with a graphical generator to automatically determine the number of metallization layers and the material for the plates in each of the metallization layers.

7. The program product of claim 5 wherein the program code is configured with a schematic generator to automatically determine the number of metallization layers and the material for the plates in each of the metallization layers.

* * * * *